(12) United States Patent
Peng et al.

(10) Patent No.: US 10,823,765 B2
(45) Date of Patent: Nov. 3, 2020

(54) LOW POWER COMPARATOR AND SELF-REGULATED DEVICE

(71) Applicant: Taiwan Semiconductor Manufacturing Co., Ltd., Hsinchu (TW)

(72) Inventors: Yung-Chow Peng, Hsinchu (TW); Chung-Peng Hsieh, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/965,994

(22) Filed: Apr. 30, 2018

(65) Prior Publication Data

US 2019/0277891 A1 Sep. 12, 2019

Related U.S. Application Data

(60) Provisional application No. 62/640,545, filed on Mar. 8, 2018.

(51) Int. Cl.
*G01R 19/00* (2006.01)
*G05F 1/66* (2006.01)
*G05F 1/44* (2006.01)

(52) U.S. Cl.
CPC .......... *G01R 19/0038* (2013.01); *G05F 1/44* (2013.01); *G05F 1/66* (2013.01)

(58) Field of Classification Search
CPC .......... G05F 1/44; G05F 1/66; G01R 19/0038

USPC .......................... 327/52, 55, 63, 67
See application file for complete search history.

(56) References Cited

U.S. PATENT DOCUMENTS

| | | | | |
|---|---|---|---|---|
| 5,821,799 A * | 10/1998 | Saripella | ........ | H03K 19/018528 327/333 |
| 7,924,067 B2 * | 4/2011 | Cowles | .......... | H03K 19/018528 327/108 |
| 2014/0132437 A1 * | 5/2014 | Danjo | ................... | H03M 1/361 341/159 |

* cited by examiner

*Primary Examiner* — Lincoln D Donovan
*Assistant Examiner* — Colleen J O Toole
(74) *Attorney, Agent, or Firm* — JCIPRNET

(57) ABSTRACT

A low power comparator and a self-regulated device for adjusting power saving level of an electronic device are provided. The low power comparator includes an input differential pair circuit, a self-regulated device, and a tail current switch. The input differential pair circuit is configured to receive input signals to be compared. The self-regulated device is coupled to the input differential pair circuit and includes a self-regulated circuit which has a first transistor with a first threshold voltage and a second transistor with a second threshold voltage and is configured to adjust a power saving level of the low-power comparator according to the first threshold voltage and the second threshold voltage. The tail current switch is coupled to the input differential pair circuit through the self-regulated circuit to provide a constant current to the input differential pair circuit.

18 Claims, 6 Drawing Sheets

LOW POWER COMPARATOR AND SELF-REGULATED DEVICE

CROSS REFERENCE TO RELATED APPLICATION

This application claims the priority benefit of U.S. provisional application Ser. No. 62/640,545, filed on Mar. 8, 2018. The entirety of the above-mentioned patent application is hereby incorporated by reference herein and made a part of specification.

BACKGROUND

Comparators are commonly used in electronic devices to compare different signals of the electronic devices. StrongARM comparator or StrongARM latch has become popular for its advantages of no static power dissipation and directly outputting rail-to-rail outputs. For example, StrongARM comparator is an essential component in Serializer/Desrializer (SerDes) or power supply monitoring (PSM) circuits and may be treated as an analog figure of merit (FoM) for monitoring power efficiency of the SerDes or PSM circuits.

In high speed multi-channel SerDes and advanced PSM, hundreds or thousands of StrongARM comparators may be used, causing relatively high power consumption. The power consumption of the StrongARM comparator is almost same during each clock cycle, since the power consumption is dominated in each refreshing cycle.

In addition, low power is the major concern for numerous applications adopting the advance technology like mobile phones, portable devices etc. Hence, low power comparator is desirable to be developed in this technical field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
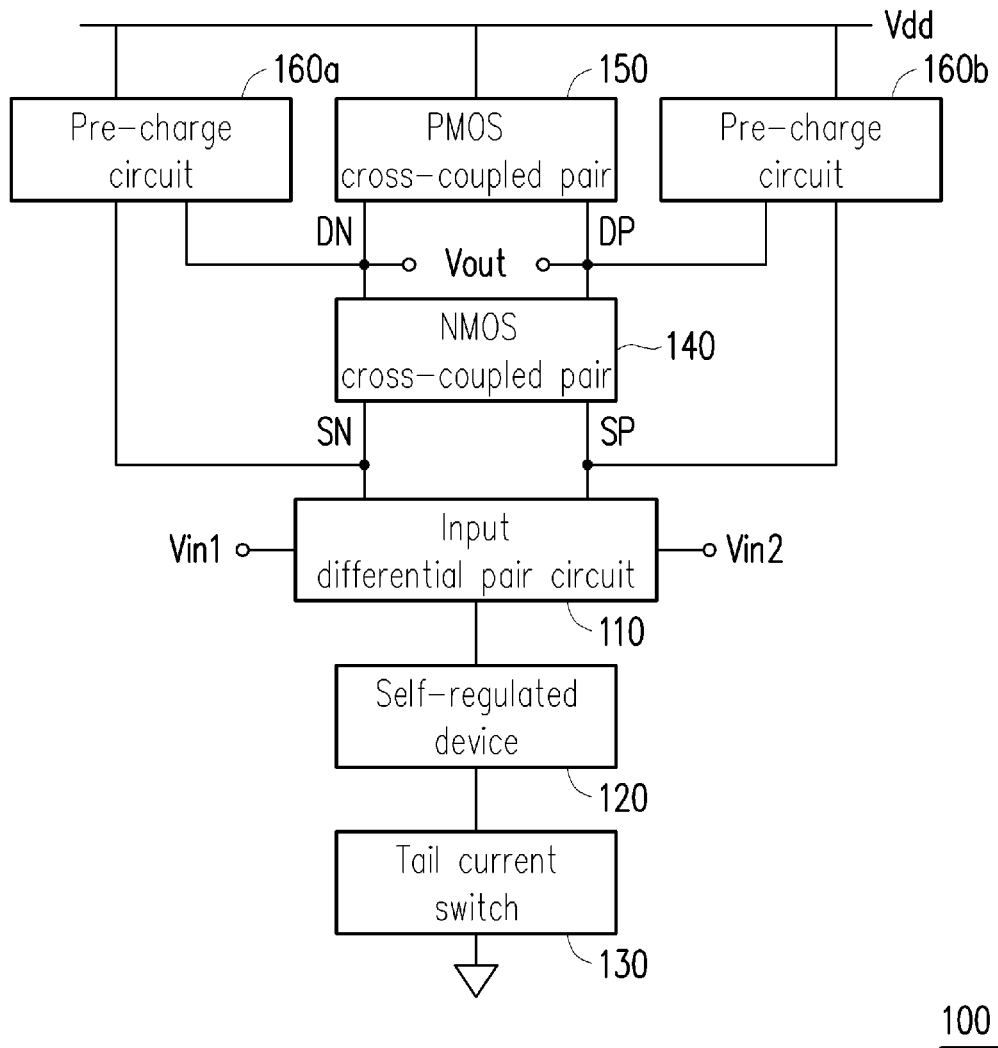
FIG. 1 illustrates a schematic block diagram of a self-regulated low power comparator according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic block diagram of a self-regulated low power comparator according to an exemplary embodiment of the disclosure. Referring to FIG. 1, a self-regulated low power comparator 100 includes an input differential pair 110, a self-regulated device 120, a tail current switch 130, a NMOS cross-coupled pair 140, a PMOS cross-coupled pair 150, and pre-charge circuits 160a and 160b. The input differential pair 110 is configured to receive input signals Vin1 and Vin2 to be compared, and provides output signals to output nodes SN and SP. The self-regulated device 120 is coupled to the input differential pair 110 and is configured to adjust a power saving level of the self-regulated low power comparator 100. The tail current switch 130 is coupled to the input differential pair 110 through the self-regulated device 120 to provide a constant current to the input differential pair circuit 110. The NMOS cross-coupled pair 140 is coupled to the input differential pair circuit 110 via the output nodes SP and SN; and the PMOS cross-coupled pair 150 is coupled to the NMOS cross-couple pair 140 via output nodes DP and DN. An output signal Vout of the self-regulated low power comparator 100 is outputted through the output nodes DP and DN. The pre-charge circuits 160a and 160b are coupled to the nodes SN, SP, DN and DP to pre-charge the nodes SN, SP, DN and DP to a predetermined voltage level (e.g., Vdd) in the refreshing operation of the self-regulated low power comparator 100.

Figure 2:
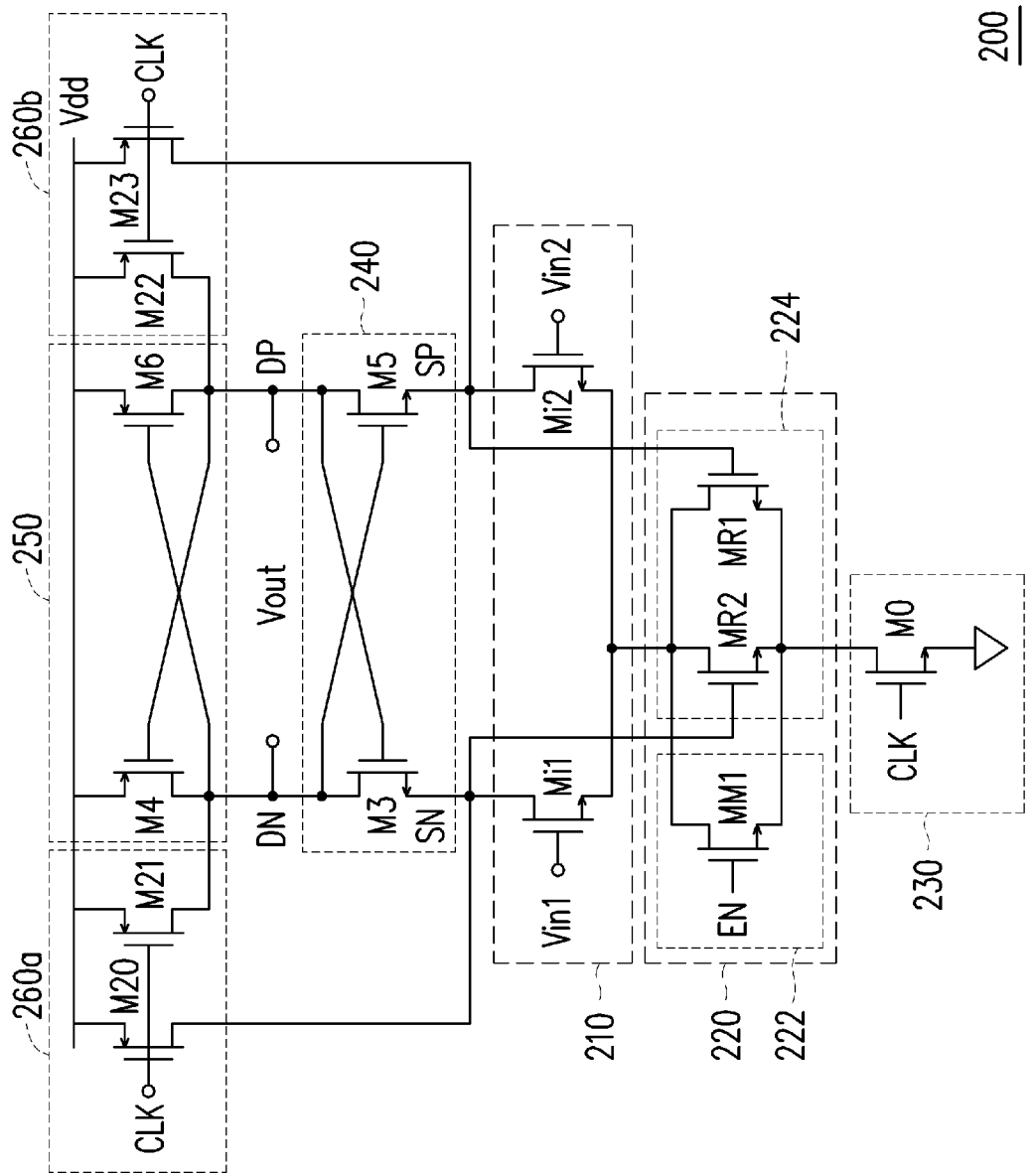
FIG. 2 illustrates detailed structures of a self-regulated low power comparator according to an exemplary embodiment of the disclosure.

FIG. 2 illustrates detailed structures of a self-regulated low power comparator 200 which includes an input differential pair circuit 210, a self-regulated device 220, a tail current switch 230, a NMOS cross-coupled pair 240, a PMOS cross-coupled pair 250, and pre-charge circuits 260a and 260b. The input differential pair circuit 210 includes transistors Mi1 and Mi2 for receiving the input signal Vin1 via a control terminal of the transistor Mi1 and receiving the input signal Vin2 via a control terminal of the transistor Mi2.

The self-regulated device 220 is coupled to the output nodes SN and SP so as to adjust power saving level of the self-regulated low power comparator 200. The self-regulated device 220 includes a mode selector 222 which has transistor MM1 and a self-regulated circuit 224 which has transistors MR1 and MR2. An enable signal EN is provided to a control terminal of the transistor MM1 to switch the self-regulated low power comparator 200 between a normal mode and a power-saving mode. For example, when the enable signal EN is in a high level state, the transistor MM1 is closed and the self-regulated device 220 acts as a short circuit to electrically connect the input differential pair circuit 210 to the tail current switch circuit 230. Since the operation of the comparator in the normal mode is well-known, the detailed description on how the comparator operates in the normal mode is omitted herein. When the enable signal EN is in a low level state, the transistor MM1 is opened, and the self-regulated low power comparator 200 is operating in a power-saving mode.

The transistor MR1 has a threshold voltage Vtn1 and the transistor MR2 has a threshold voltage Vtn2, where the threshold voltage Vtn1 may be different or the same with the threshold voltage Vtn2. The control terminals of the transistors MR1 and MR2 are connected to the output nodes SP and SN of input differential pair circuit 210, respectively. The sources and the drains of the transistor MR1 and MR2 are coupled to the input differential pair circuit 210 and the tail current switch circuit 230, respectively.

The self-regulated circuit 224 is configured to adjust the power saving level of the self-regulated low power comparator 200 according to the threshold voltages Vtn1 and Vtn2 of the transistor MR1 and MR2. Particularly, after a comparison operation is completed, the output node SP of the input differential pair circuit 210 is regulated to the threshold voltage Vtn1 by the transistor MR1 and the output node SN of the input differential pair circuit 210 is regulated to the threshold voltage Vtn2 by the transistor MR2. In this way, in a refresh operation of the self-regulated low power comparator 200, the output node SP is charged from the threshold voltage Vtn1 to the predetermined voltage level (Vdd) instead of charging from ground voltage level (0V) to the predetermined voltage level (Vdd). Similarly, the output node SN is charged from the threshold voltage Vtn2 to the predetermined voltage level (Vdd) instead of charging from ground voltage level (0V) to the predetermined voltage level (Vdd). Accordingly, power consumption for refresh operation (e.g., refresh cycle) is reduced, and the self-regulated low power comparator 200 achieves effect of power saving.

Since the power-saving level of the self-regulated low power comparator 200 is determined according to the threshold voltages Vtn1 and Vtn2 of the transistors MR1 and MR2, the transistors MR1 and MR2 may be selected to satisfy designed needs about the power-saving level. By adopting different types of transistors MR1 and MR2 which have different threshold voltages (e.g., standard Vtn, low Vtn, ultra-low Vtn and extra low Vtn), the power saving level is achieved at different rate. The higher the threshold voltages of transistors MR1 and MR2 are, the more power is saved. For example, the transistors MR1 and MR2 with standard Vtn may achieve higher power saving level than the transistors MR1 and MR2 with ultra-low Vtn and extra low Vtn.

In FIG. 2, the transistors Mi1, Mi2, MM1, MR1 and MR2 are N-type Complementary Metal-Oxide-Semiconductor (NMOS) transistors, but a type of the transistors and a number of transistors are not limited in the disclosure.

The tail current switch 230 includes a switch M0 that is coupled to the input differential pair circuit 210 through the self-regulated device 220 to provide the constant current to the input differential pair 210 through the self-regulated device 220. In some embodiments, the control terminal of the switch M0 receives a clock signal CLK, and the switch M0 is switched on or off according to the clock signal CLK.

The NMOS cross-coupled pair 240 includes transistors M3 and M5; and the PMOS cross-coupled pair 250 includes transistor M4 and M6, where the NMOS cross-coupled pair 240 is coupled to the PMOS cross-coupled pair 250 through the output nodes DP and DN. The drains of the transistors M3 and M4 and the gates of the transistor M5 and M6 are coupled to the output node DN; the drains of the transistors M5 and M6 and the gates of the transistor M3 and M4 are coupled to the output node DP. The source of the transistor M3 is coupled to the output node SN and the source of the transistor M5 is coupled to the node SP.

The pre-charge circuit 260a includes transistors M20 and M21 and the pre-charge circuit 260b includes transistors M22 and M23. The pre-charge circuit 260a is configured to charge or refresh the output nodes DN and SN to the predetermined voltage (Vdd) in the refreshing operation of the self-regulated low power comparator 200. Similarly, the pre-charge circuit 260b is configured to charge or refresh the output nodes DP and SP to the predetermined voltage (Vdd) in the refreshing operation of the self-regulated low power comparator 200.

Figure 3:
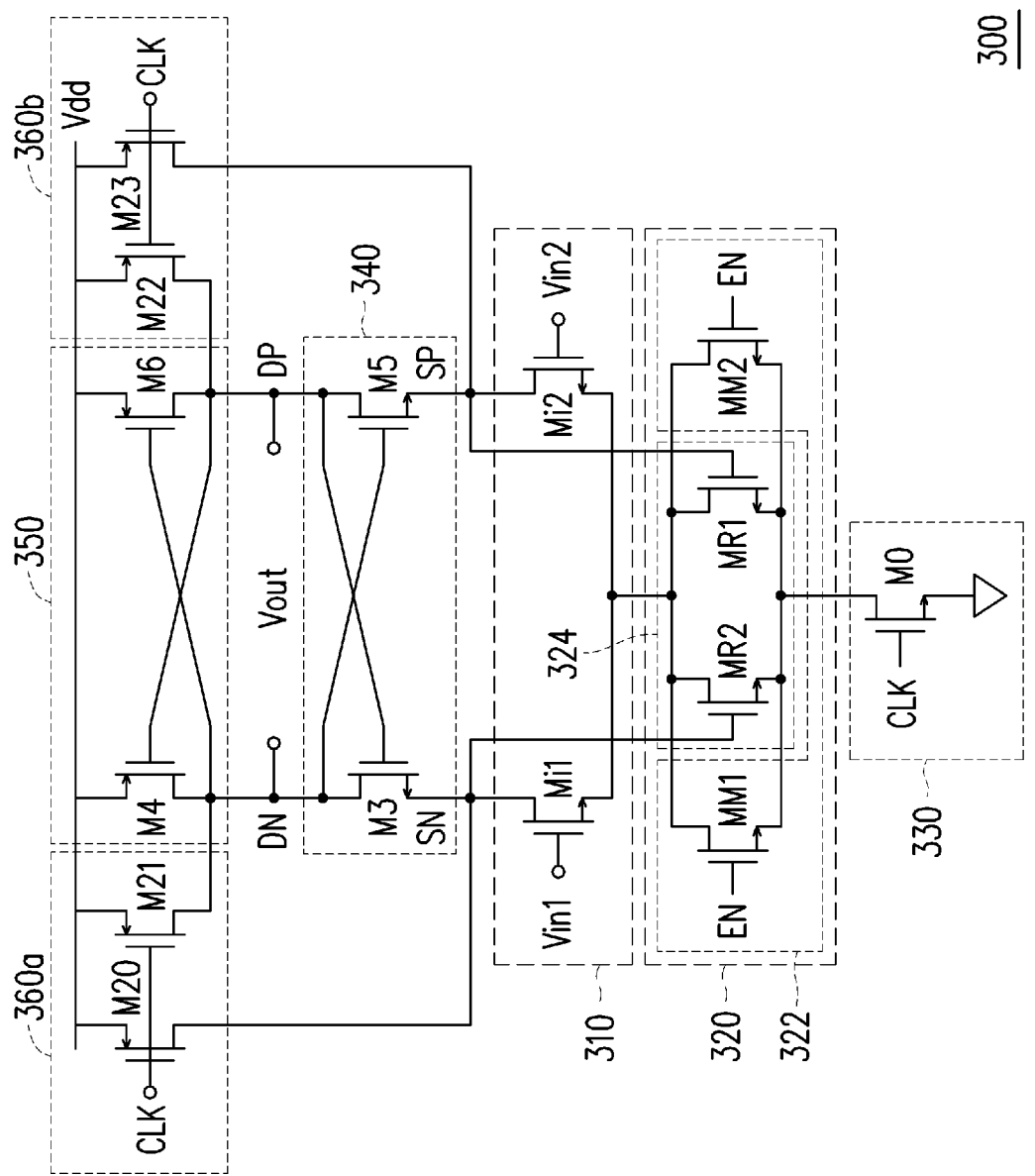
FIG. 3 illustrates detailed structures of a self-regulated low power comparator according to another exemplary embodiment of the disclosure.

FIG. 3 illustrates detailed structures of a self-regulated low power comparator according to another exemplary embodiment of the disclosure. Referring to FIG. 3, a self-regulated low power comparator 300 includes a differential pair circuit 310, a self-regulating device 320, a tail current switch circuit 330, a NMOS cross-coupled pair 340, a PMOS cross-coupled pair 350 and pre-charge circuits 360a and 360b. The differential pair circuit 310, the tail current switch circuit 330, the NMOS cross-coupled pair 340, the PMOS cross-coupled pair 350 and the pre-charge circuits 360a and 360b are similar to the differential pair circuit 210, the tail current switch circuit 230, the NMOS cross-coupled pair 240, the PMOS cross-coupled pair 250 and the pre-charge circuits 260a and 260b, thus the detailed description of these circuits is omitted herein.

The self-regulating device 320 includes a mode selector 322 and a self-regulating circuit 324. The self-regulating circuit 324 includes transistors MR1 and MR2 which are similar to the transistors MR1 and MR2 of the self-regulating circuit 224 in FIG. 2. The mode selector 322 comprises transistors MM1 and MM2, where the gates of both transistors MM1 and MM2 receive the enable signal EN; the drains of transistors MM1 and MM2 are coupled to the drains of transistors MR1 and MR2; and the sources of transistors MM1 and MM2 are coupled to the sources of transistors MR1 and MR2. The transistors MM1 and MM2 are configured to select the operating mode of the self-regulated low power comparator 300 between the normal mode and the power-saving mode according to the enable signal EN.

Figure 4:
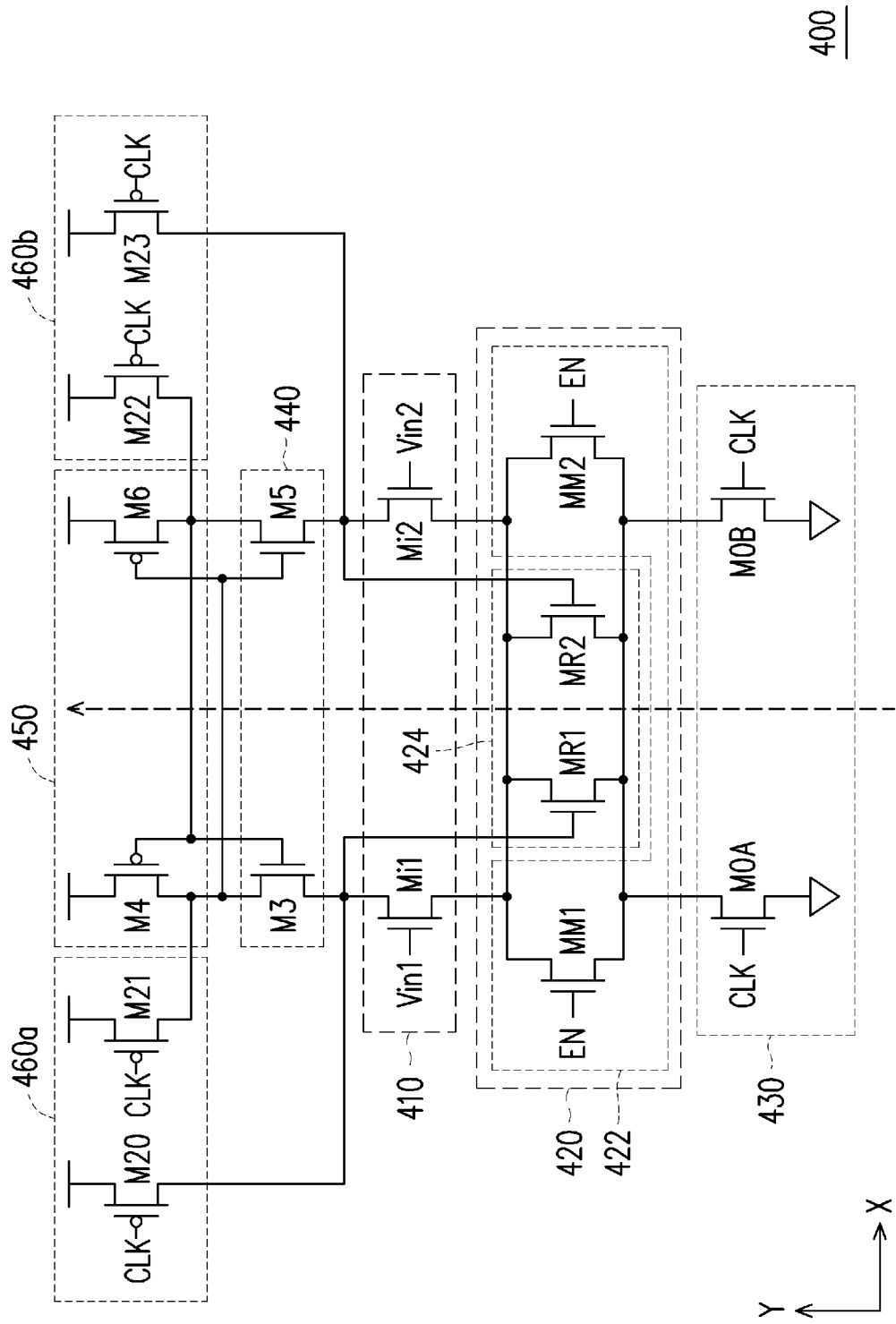
FIG. 4 illustrates a schematic diagram of a self-regulated low power comparator according to an exemplary embodiment of the disclosure.

FIG. 4 illustrates a self-regulated low power comparator 400 according to an exemplary embodiment of the disclosure. In general, circuit components of the self-regulated low power comparator 400 are arranged symmetrically with respect to a first direction (e.g., Y-axis). The self-regulated low power comparator 400 includes an input differential pair circuit 410, a self-regulated device 420, a tail current switch 430, a NMOS cross-coupled pair 440, a PMOS cross-coupled pair 450 and pre-charge circuits 460a and 460b.

The input differential pair circuit 410 includes transistors Mi1 and Mi1 which are arranged symmetrically in the first direction. The self-regulating device 420 includes a mode selector 422 and a self-regulated circuit 424, where the transistors MM1 and MM2 of the mode selector 422 are arranged symmetrically in the first direction and the transistors MR1 and MR2 of the self-regulated circuit 424 are arranged symmetrically in the first direction.

The tail current switch 430 comprises transistors MOA and MOB which are configured to provide a constant current to the differential input pair circuit 410 through the self-regulating device 420. The transistors MOA and MOB are arranged symmetrically in the first direction.

The NMOS cross-coupled pair 440 has transistors M3 and M5 arranged in symmetrically in the first direction; and the PMOS cross-coupled pair 450 has transistors M4 and M6 arranged symmetrically in the first direction. The pre-charge circuits 460a and 460b are also arranged symmetrically in the first direction. Particularly, the transistors M20 and M21 of the pre-charge circuit 460a are arranged symmetrically to the transistors M22 and M23 of the pre-charge circuit 460a in the first direction.

By arranging the components of the self-regulated low power comparator 400 symmetrically in the first direction, a better matching between the components are achieved. In addition, the arrangement of transistors symmetrically in the specific direction minimizes the connecting distance (also known as routing distance) between the components which lowers the parasitic capacitance between the components which in turn enables the circuit to operate with higher speed at low power.

Figure 5:
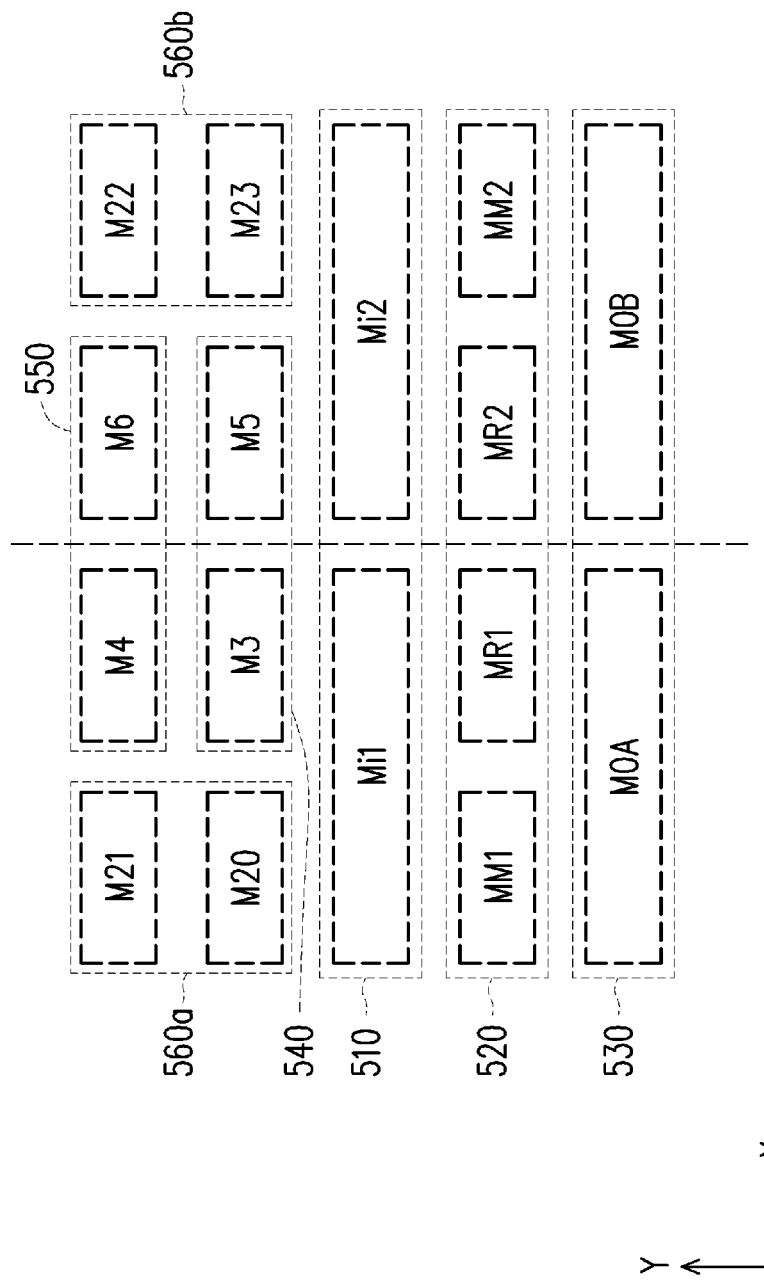
FIG. 5 illustrates a layout placement diagram of a self-regulated low power comparator according to an exemplary embodiment of the disclosure.

FIG. 5 shows a layout placement diagram of a self-regulated low power comparator 500 including an input differential pair circuit 510, a self-regulated device 520, a tail current switch 530, a NMOS cross-coupled pair 540 and a PMOS cross-coupled pair 550 and pre-charge circuits 560a and 560b. The placements of the layout components are similar to the circuit diagram of the self-regulated low power comparator 400. Each of the device blocks are arranged symmetrically in the first direction. Particularly, the transistors in each of the input differential pair circuit 510, the self-regulated device 520, the tail current switch 530, the NMOS cross-coupled pair 540 and the PMOS cross-coupled pair 550 are arranged symmetrically in the first direction. The pre-charge circuit 560a and the pre-charge circuit 560b are arranged symmetrically in the first direction. By the symmetric layout placement of the self-regulated low power comparator 500, the comparator achieves short routing distance, low power and better matching performance.

Figure 6:
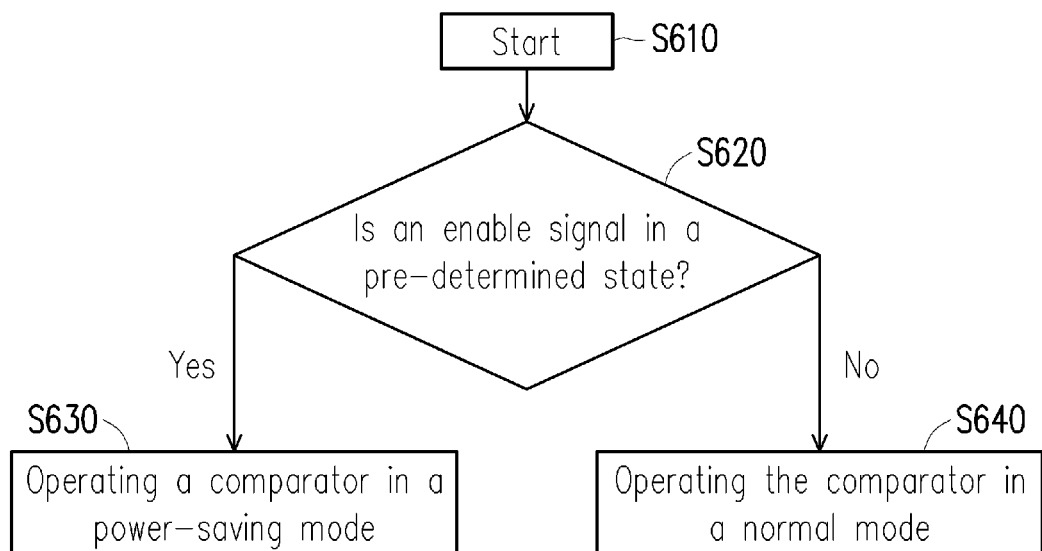
FIG. 6 illustrates a flow chart for selecting an operation mode of a self-regulated low power comparator according to an exemplary embodiment of the disclosure.

FIG. 6 shows a flowchart for selecting an operation mode of a self-regulated low power comparator according to an exemplary embodiment of the disclosure. In steps S610 and S620, it determines whether an enable signal EN which is inputted to a mode selector is in a pre-determined state (e.g., low level state). If the enable signal EN is in the pre-determined state, the comparator is switched to be operated in a power-saving mode in step S630. Otherwise, if the enable signal EN is not in the pre-determined state (e.g., the enable signal EN is in a high level state), the comparator is switched to be operated in a normal mode in step S640. In the normal mode, the comparator operates as a typical comparator with relatively high power consumption. In the power-saving mode, the power consumption in each refreshing cycle of the comparator is reduced, thereby reducing overall power consumption of the comparator.

In some embodiments, by adjusting the power saving level of the low-power comparator according to the first threshold voltage and the second threshold voltage of the first and second transistors in the self-regulating device, the power consumption for each refreshing cycle of the comparator is significantly reduced, thereby reducing the overall power consumption of the comparator. In some embodiments, by selecting the transistors of self-regulating device with appropriate threshold values, the power-saving level of the comparators may be adjusted. In some embodiments, the symmetrical placement of devices in the layout results in great matching performance, minimizes the routing distance to reduce the parasitic capacitance between the devices, and enables the circuit to operate at high speed with low power.

According to some embodiments of the disclosure, a low-power comparator which includes an input differential pair circuit, a self-regulated device, and a tail current switch is introduced. The input differential pair circuit is configured to receive input signals to be compared. The self-regulated device is coupled to the input differential pair circuit and comprises a self-regulated circuit, which has a first transistor with a first threshold voltage and a second transistor with a second threshold voltage and is configured to adjust a power saving level of the low-power comparator according to the first threshold voltage and the second threshold voltage. The tail current switch is coupled to the input differential pair circuit through the self-regulated circuit to provide a constant current to the input differential pair circuit.

According to some embodiments of the disclosure, a low-power comparator which includes an input differential pair circuit, a self-regulated device and a tail current switch is introduced. The input differential pair circuit includes a first pair of transistors arranged symmetrically in a first direction. The self-regulated device is coupled to the input differential pair circuit, wherein the self-regulated device comprises a self-regulated circuit which has a third pair of transistors arranged symmetrically in the first direction. The self-regulated circuit is configured to adjust the power saving level of the low-power comparator according to threshold voltages of the third pair of transistors. The tail current switch is coupled to the self-regulated device and includes a fourth pair of transistors arranged symmetrically in the first direction.

According to some embodiments of the disclosure, a self-regulated device for adjusting power saving level of an electronic device which has an input differential pair circuit is also introduced. The self-regulated device includes a self-regulated circuit that has a first transistor with a first threshold voltage and a second transistor with a second threshold voltage. The self-regulated circuit is configured to adjust the power saving level of the electronic device according to the first threshold voltage and the second threshold voltage. A control terminal of the first transistor is coupled to a first output terminal of the input differential pair circuit and a control terminal of the second transistor is coupled to a second output terminal of the input differential pair circuit.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A low-power comparator, comprising:
an input differential pair circuit, configured to receive input signals to be compared;

a self-regulated device, coupled to the input differential pair circuit, wherein the self-regulating device comprises:
  a self-regulated circuit, having a first transistor with a first threshold voltage and a second transistor with a second threshold voltage, configured to adjust a power saving level of the low-power comparator according to the first threshold voltage and the second threshold voltage; and
  a mode selector, configured to enable the self-regulated circuit during a power saving mode of the low-power comparator and disable the self-regulated circuit during a normal mode of the low-power comparator; and
a tail current switch, coupled to the input differential pair circuit through the self-regulated circuit to provide a constant current to the input differential pair circuit,
wherein a control terminal of the first transistor is electrically coupled to a first output node of the input differential pair circuit, a control terminal of the second transistor is electrically coupled to a second output node of the input differential pair circuit, and the control terminal of the first transistor is electrically insulated from the control terminal of the second transistor during a comparison operation of the low-power comparator,
wherein the mode selector comprises a third transistor, a control terminal of the third transistor receives an enable signal, a first terminal of the third transistor is coupled to a first terminal of the first transistor, a first terminal of the second transistor and the input differential pair circuit, and a second terminal of the third transistor is coupled to a second terminal of the first transistor, and a second terminal of the second transistor and the tail current switch.

2. The low-power comparator of claim 1, wherein a semiconductor type of the first transistor is same as a semiconductor type of the second transistor of the self-regulated circuit.

3. The low-power comparator of claim 1, wherein
the first output node of the input differential pair circuit is regulated to the first threshold voltage by the first transistor when a comparison operation of the low-power comparator is completed, and
the second output node of the input differential pair circuit is regulated to the second threshold voltage by the second transistor when the comparison operation is completed.

4. The low-power comparator of claim 3, further comprising:
a pre-charge circuit, coupled to the input differential pair circuit, wherein
the pre-charge circuit refreshes the first output node of the input differential pair circuit from the first threshold voltage to a predetermined voltage in a refreshing operation of the electronic device, and
the pre-charge circuit refreshes the second output node of the input differential pair circuit from the second threshold voltage to the predetermined voltage in the refreshing operation of the electronic device.

5. The low-power comparator of claim 4, further comprising:
a transistor cross-coupled pair, having a third output node and a fourth output node, wherein
the third output node is regulated to the first threshold voltage by the first transistor when the comparison operation is completed, and
the fourth output node is regulated to the second threshold voltage by the second transistor when the comparison operation is completed.

6. The low-power comparator of claim 1, wherein
the mode selector is configured to enable the self-regulated device based on an enable signal in the power saving mode, and
the mode selector is configured to disable the self-regulated based on the enable signal in the normal mode.

7. The low-power comparator of claim 6, wherein
the mode selector further comprises a third transistor and a fourth transistor,
a control terminal of the fourth transistor receive the enable signal,
a first terminal of the fourth transistor are coupled to a first terminal of the first transistor and a first terminal of the second transistor, and
a second terminal of the fourth transistor are coupled to a second terminal of the first transistor and a second terminal of the second transistor.

8. A low-power comparator, comprising:
an input differential pair circuit, comprising a first pair of transistors arranged symmetrically in a first direction;
a self-regulated device, coupled to the input differential pair circuit, wherein the self-regulated device comprises:
  a self-regulated circuit, comprising a third pair of transistors arranged symmetrically in the first direction, configured to adjust the power saving level of the low-power comparator according to threshold voltages of the third pair of transistors; and
  a mode selector, configured to enable the self-regulated circuit during a power saving mode of the low-power comparator and disable the self-regulated circuit during a normal mode of the low-power comparator; and
a tail current switch, coupled to the self-regulated device, comprising a fourth pair of transistors arranged symmetrically in the first direction,
wherein the third pair of transistors comprises a first transistor and a second transistor, a control terminal of the first transistor is coupled to a first output node of the input differential pair circuit, a control terminal of the second transistor is coupled to a second output node of the input differential pair circuit, and the control terminal of the first transistor is electrically insulated from the control terminal of the second transistor during a comparison operation of the low-power comparator,
wherein the mode selector comprises a third transistor, a control terminal of the third transistor receives an enable signal, a first terminal of the third transistor is coupled to a first terminal of the first transistor, a first terminal of the second transistor and the input differential pair circuit, and a second terminal of the third transistor is coupled to a second terminal of the first transistor, and a second terminal of the second transistor and the tail current switch.

9. The low-power comparator of claim 8, wherein the self-regulated device is disposed between the input differential pair circuit and the tail current switch.

10. The low-power comparator of claim 8, further comprising:
a first transistor cross-coupled pair, coupled to the input differential pair circuit; and
a second transistor cross-coupled pair, coupled to the first transistor cross-coupled pair, wherein one transistor of the first transistor cross-coupled pair and one transistor of the second transistor cross-coupled pair are arranged symmetrically in the first direction, and another one transistor of the first transistor cross-coupled pair and another one transistor of the second transistor cross-coupled pair are arranged symmetrically in the first direction.

11. The low-power comparator of claim 8, wherein a semiconductor type of the first transistor is same as a semiconductor type of the second transistor of the self-regulated circuit.

12. The low-power comparator of claim 8, wherein
the mode selector further comprises a fourth transistor,
a control terminal of the fourth transistor receive an enable signal,
a first terminal of the fourth transistor are coupled to a first terminal of the first transistor and a first terminal of the second transistor, and
a second terminal of the fourth transistor are coupled to a second terminal of the first transistor and a second terminal of the second transistor.

13. A self-regulated device for adjusting power saving level of an electronic device which has an input differential pair circuit, the self-regulated device comprising:
a self-regulated circuit, having a first transistor with a first threshold voltage and a second transistor with a second threshold voltage, configured to adjust the power saving level of the electronic device according to the first threshold voltage and the second threshold voltage; and
a mode selector, configured to enable the self-regulated circuit during a power saving mode of the low-power comparator and disable the self-regulated circuit during a normal mode of the low-power comparator,
wherein a control terminal of the first transistor is electrically coupled to a first output terminal of the input differential pair circuit, a control terminal of the second transistor is electrically coupled to a second output terminal of the input differential pair circuit and the control terminal of the first transistor is electrically insulated from the control terminal of the second transistor during a comparison operation of the electronic device,
wherein the mode selector comprises a third transistor, a control terminal of the third transistor receives an enable signal, a first terminal of the third transistor is coupled to a first terminal of the first transistor, a first terminal of the second transistor and the input differential pair circuit, and a second terminal of the third transistor is coupled to a second terminal of the first transistor, and a second terminal of the second transistor and the tail current switch.

14. The self-regulated device of claim 13, wherein
the input differential pair circuit comprising a pair of transistors having a common terminal, wherein the common terminal is coupled to a first terminal of the first transistor and a first terminal of the second transistor.

15. The self-regulated device of claim 14, wherein
the electronic device is a comparator,
the first output terminal of the input differential pair circuit is regulated to the first threshold voltage by the first transistor when a comparison operation of the comparator is completed,
the second output terminal of the input differential pair circuit is regulated to the second threshold voltage by the second transistor when the comparison operation is completed, and
a semiconductor type of the first transistor is same as a semiconductor type of the second transistor of the self-regulated circuit.

16. The self-regulated device of claim 15, wherein
the electronic device further comprises a pre-charge circuit coupled to the input differential pair circuit, and wherein
the first output terminal of the input differential pair circuit is refreshed from the first threshold voltage to a predetermined voltage by the pre-charge circuit in a refreshing operation of the electronic device, and
the second output terminal of the input differential pair circuit is refreshed from the second threshold voltage to the predetermined voltage by the pre-charge circuit in the refreshing operation of the electronic device.

17. The self-regulated device of claim 13, wherein
the mode selector is configured to enable the self-regulated device based on an enable signal in the power saving mode, and
the mode selector is configured to disable the self-regulated device based on the enable signal in the normal mode.

18. The self-regulated device of claim 17, wherein
the mode selector comprises a third transistor and a fourth transistor a control terminal of the third transistor and a control terminal of the fourth transistor receive the enable signal,
a first terminal of the third transistor and a first terminal of the fourth transistor are respectively coupled to a first terminal of the first transistor and a first terminal of the second transistor, and
a second terminal of the third transistor and a second terminal of the fourth transistor are respectively coupled to a second terminal of the first transistor and a second terminal of the second transistor.

* * * * *